(12) United States Patent
Jeon et al.

(10) Patent No.: US 11,721,947 B2
(45) Date of Patent: Aug. 8, 2023

(54) OPTICAL COMPENSATION SYSTEM FOR LASER BEAM AND EXCIMER LASER ANNEALING DEVICE

(71) Applicants: Chongqing BOE Display Technology Co., Ltd., Chongqing (CN); BOE Technology Group Co., Ltd., Beijing (CN)

(72) Inventors: Sangho Jeon, Beijing (CN); Junsung Kang, Beijing (CN); Zhaoli Lu, Beijing (CN); Songlin Liu, Beijing (CN); Ruoyao Li, Beijing (CN); Hailan Piao, Beijing (CN)

(73) Assignees: Chongqing BOE Display Technology Co., Ltd., Chongqing (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/488,078

(22) Filed: Sep. 28, 2021

(65) Prior Publication Data
US 2022/0102934 A1    Mar. 31, 2022

(30) Foreign Application Priority Data
Sep. 29, 2020   (CN) ......................... 202011050289.X (51) Int. Cl.
*H01S 3/00*       (2006.01)
*H01S 3/13*       (2006.01)
(Continued)

(52) U.S. Cl.
CPC .............. *H01S 3/13* (2013.01); *H01S 3/0071* (2013.01); *H01S 3/2207* (2013.01); *H01S 3/225* (2013.01)

(58) Field of Classification Search
CPC ........ H01S 3/13; H01S 3/0071; H01S 3/2207; H01S 3/225
See application file for complete search history.

(56) References Cited

U.S. PATENT DOCUMENTS

2003/0226834 A1* 12/2003 Ishikawa ............... C23C 16/483
                                                              219/121.77
2010/0108913 A1*  5/2010 Ershov .................... H01S 3/225
                                                              250/492.1
(Continued)

FOREIGN PATENT DOCUMENTS

| CN | 105321850 A | 2/2016 |
| CN | 110600367 A | 12/2019 |
| CN | 110661167 A | 1/2020 |

OTHER PUBLICATIONS

CN 202011050289.X first office action.

*Primary Examiner* — Kinam Park
(74) *Attorney, Agent, or Firm* — IPro, PLLC (57) ABSTRACT

An optical compensation system for a laser beam and an excimer laser annealing device are provided in the present disclosure. The optical compensation system for the laser beam includes a laser source, a beam splitter and a reversion assembly. The laser beam emitted by the laser source enters the beam splitter, and is divided by the beam splitter into a first light beam and a second light beam having different transmission paths. The second light beam is reversed and reflected by the reversion assembly, enters the beam splitter, and exits from the beam splitter together with the first light beam. An asymmetry of the second light beam reversed by the reversion assembly is different from an asymmetry of the first light beam.

12 Claims, 4 Drawing Sheets

(51) Int. Cl.
*H01S 3/22* (2006.01)
*H01S 3/225* (2006.01)

(56) References Cited

U.S. PATENT DOCUMENTS

2016/0252732 A1* 9/2016 Cho .................. G02B 27/0905
　　　　　　　　　　　　　　　　　　　　219/121.6
2017/0075124 A1* 3/2017 So ........................ H01S 3/0085

* cited by examiner

Fig.1

Fig.2 laser beam     output light beam

OPTICAL COMPENSATION SYSTEM FOR LASER BEAM AND EXCIMER LASER ANNEALING DEVICE

CROSS-REFERENCE TO RELATED APPLICATION

The present application claims a priority to Chinese Patent Application No. 202011050289.X filed in China on Sep. 29, 2020, the disclosure of which is incorporated herein in its entirety by reference.

TECHNICAL FIELD

The present disclosure relates to the field of display technology, and in particular to an optical compensation system for a laser beam and an excimer laser annealing device.

BACKGROUND

In the related art, in an organic electroluminescent element, a polysilicon layer in a backplane may be fabricated by using such a process as excimer laser annealing, solid phase crystallization or metal induced crystallization. An excimer laser annealing process is a relatively complex annealing process. A flatness of a crystallized polysilicon film, a control of a grain size and grain uniformity are adversely affected by an instability of a light beam emitted by an excimer laser annealing device.

SUMMARY

An optical compensation system for a laser beam and an excimer laser annealing device are provided in the embodiments of the present disclosure.

According to the embodiments of the present disclosure, the optical compensation system for the laser beam includes a laser source, a beam splitter and a reversion assembly. The laser beam emitted by the laser source enters the beam splitter, and is divided by the beam splitter into a first light beam and a second light beam having different transmission paths, and the second light beam is reversed and reflected by the reversion assembly, enters the beam splitter, and exits from the beam splitter together with the first light beam. An asymmetry of the second light beam reversed by the reversion assembly is different from an asymmetry of the first light beam.

In some embodiments of the present disclosure, the asymmetry of the second light beam reversed by the reversion assembly is opposite to the asymmetry of the first light beam.

In some embodiments of the present disclosure, a part of the laser beam is reflected by the beam splitter, to form the first light beam, the other part of the laser beam passes through the beam splitter, to form the second light beam, the reversion assembly includes at least two reflective mirrors, and the second light beam is sequentially reflected by the at least two reflective mirrors, enters the beam splitter, and exits from the beam splitter together with the first light beam.

In some embodiments of the present disclosure, a transmission direction of the laser beam and a transmission direction of the first light beam and the second light beam together exiting from the beam splitter are perpendicular to each other.

In some embodiments of the present disclosure, a light ray of the laser beam at a first position is reflected by the beam splitter, to form a light ray of the first light beam at a second position, a light ray of the laser beam at a third position is reflected by the beam splitter to form a light ray of the first light beam at a fourth position, a direction from the third position to the first position is the transmission direction of the first light beam and the second light beam together exiting from the beam splitter, a direction from the fourth position to the third position is the transmission direction of the laser beam, and the first position and the third position are symmetrical with respect to a center line of the laser beam. Another light ray of the laser beam at the first position passes through the beam splitter, is reversed by the reversion assembly, passes through the beam splitter again, and exits at the fourth position together with the light ray of the first light beam at the fourth position. Another light ray of the laser beam at the third position passes through the beam splitter, is reversed by the reversion assembly, passes through the beam splitter again, and exits at the second position together with the light ray of the first light beam at the second position.

In some embodiments of the present disclosure, the reversion assembly includes a first reflective mirror and a second reflective mirror. The second light beam is sequentially reflected by the first reflective mirror and the second reflective mirror, passes through the beam splitter, and exits from the beam splitter together with the first light beam.

In some embodiments of the present disclosure, a transmission direction of the first light beam and the transmission direction of the laser light beam are perpendicular to each other, and an angle between a reflection surface of the first reflective mirror and a reflection surface of the second reflective mirror is 45°.

In some embodiments of the present disclosure, the reversion assembly includes a first reflective mirror, a second reflective mirror, and a third reflective mirror. The second light beam is sequentially reflected by the first reflective mirror, the second reflective mirror and the third reflective mirror, enters the beam splitter, and is reflected by the beam splitter, to transmit together with the first light beam.

In some embodiments of the present disclosure, an angle between a reflection surface of the first reflective mirror and a reflection surface of the second reflective mirror is equal to an angle between the reflection surface of the second reflective mirror and a reflection surface of the third reflective mirror.

In some embodiments of the present disclosure, the angle between the reflection surface of the first reflective mirror and the reflection surface of the second reflective mirror, the angle between the reflection surface of the second reflective mirror and the reflection surface of the third reflective mirror, and an angle between the reflection surface of the first reflective mirror and the reflection surface of the third reflective mirror are equal to each other.

In some embodiments of the present disclosure, orthographic projections of the first reflective mirror, the second reflective mirror and the third reflective mirror onto a same plane form a triangle-like shape, and an orthographic projection of the beam splitter onto the same plane crosses a line connecting any point of an orthographic projection of the first reflective mirror onto the same plane and any point of an orthographic projection of the third reflective mirror onto the same plane.

In some embodiments of the present disclosure, a ratio of the first light beam to the second light beam is 1:1.

In some embodiments of the present disclosure, the optical compensation system for the laser beam further includes a transmission assembly configured to transmit the laser beam emitted by the laser source to the beam splitter.

In some embodiments of the present disclosure, the system for path compensation of laser beam further includes a homogenizing lens configured to convert the first light beam and the second light beam together exiting from the beam splitter into a linear light beam.

In some embodiments of the present disclosure, the laser source includes an XeCl excimer laser.

According to the embodiments of the present disclosure, an excimer laser annealing device includes the optical compensation system for the laser beam according to any one of the above-mentioned embodiments.

The additional aspects and advantages of the present disclosure will be given or may become apparent in the following description, or may be understood through the implementation of the present disclosure.

BRIEF DESCRIPTION OF THE DRAWINGS

The above and/or additional aspects as well as advantages of the present disclosure will become apparent and are easily understood in the following description with reference with the following drawings. In these drawings.

DETAILED DESCRIPTION

The embodiments of the present disclosure will be described hereinafter in conjunction with the embodiments and the drawings. Identical or similar reference numbers in the drawings represent an identical or similar element or elements having an identical or similar function. The following embodiments are for illustrative purposes only, but shall not be used to limit the scope of the present disclosure.

In the description of the present disclosure, it should be appreciated that, such words as "first", and "second" may be merely used to differentiate different components rather than to indicate or imply any importance or explicitly indicate the number of the defined technical features. In this regard, the technical features defined with such words as "first" and "second" may implicitly or explicitly include one or more technical features. Further, such an expression as "a plurality of" is used to indicate that there are at least two, e.g., two or three, components, unless otherwise specified.

Many different embodiments or examples are provided hereinafter to achieve different structures in the present disclosure. For ease of description, the components and arrangements in specific examples will be described below. Of course, they are merely illustrative rather than restrictive. In addition, reference numerals and/or reference letters are repeated in different examples in the present disclosure, which is for the purpose of simplification and clarity and does not indicate the relationship between the various embodiments and/or arrangements. In addition, the present disclosure provides examples of various specific processes and materials, but a person skilled in the art may realize the application of other processes and/or the use of other materials.

Figure 1:
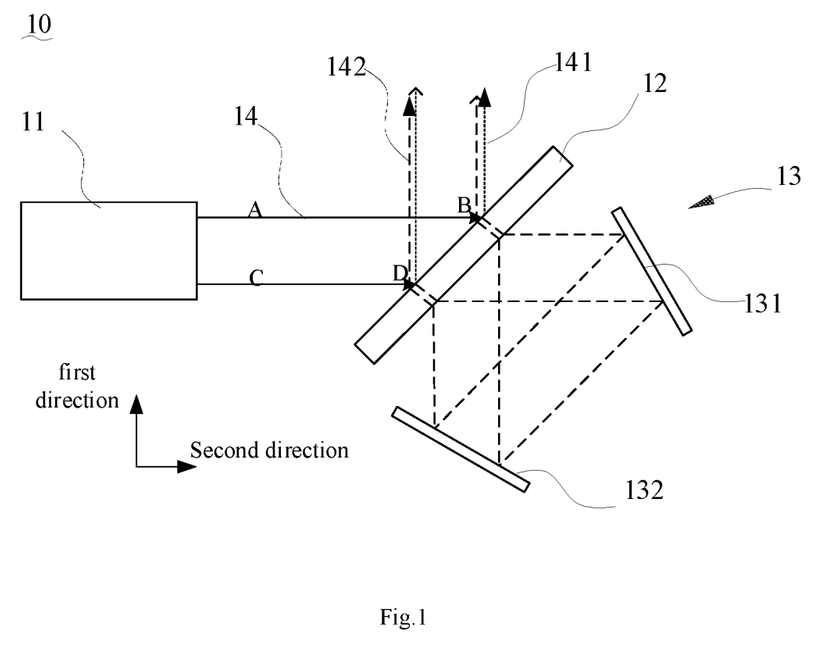
FIG. 1 is a structural diagram of an optical compensation system for a laser beam according to the embodiments of the present disclosure.
Figure 2:
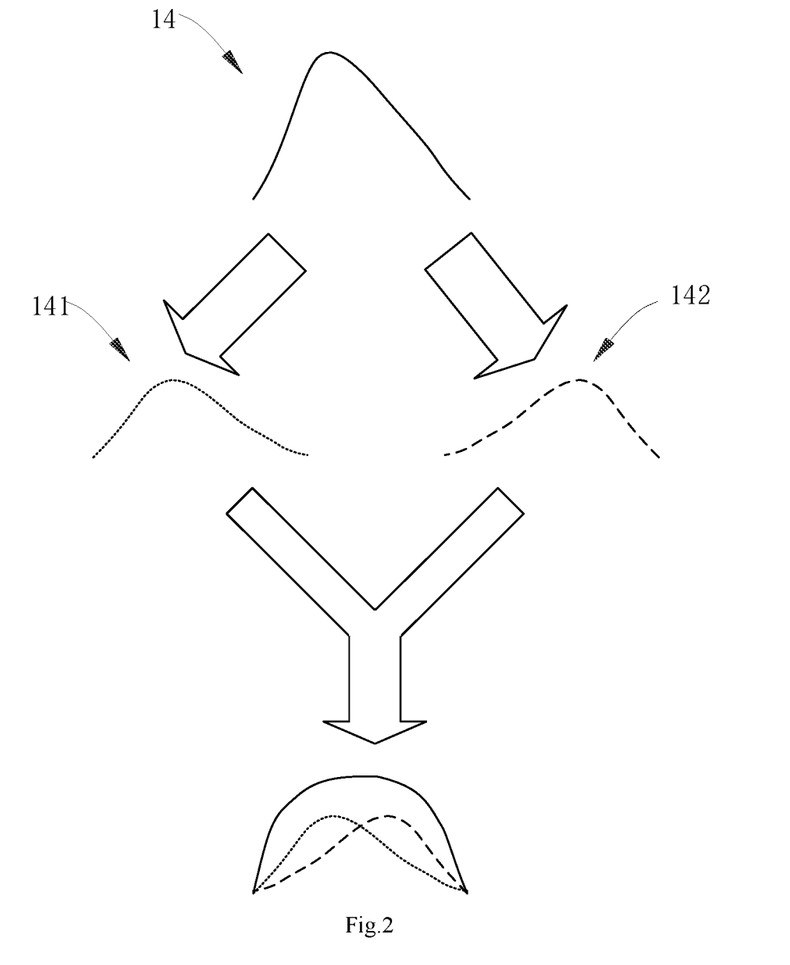
FIG. 2 is a schematic diagram of a compensation for an asymmetry of a laser beam according to the embodiments of the present disclosure.
Figure 5:
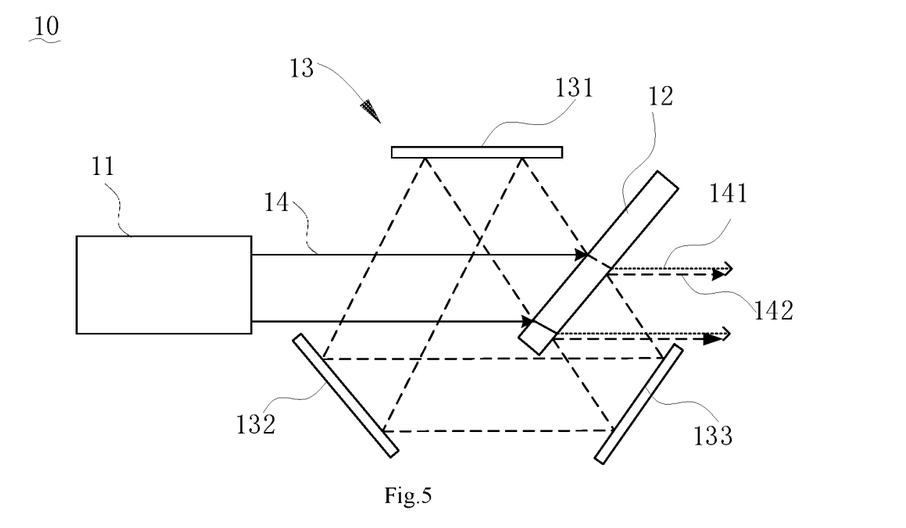
FIG. 5 is another structural diagram of the optical compensation system for the laser beam according to the embodiments of the present disclosure.

Referring to FIGS. 1, 2 and 5, an optical compensation system 10 for a laser beam is provided in the embodiments of the present disclosure. The optical compensation system 10 for the laser beam includes a laser source 11, a beam splitter 12 and a reversion assembly 13. The laser beam 14 emitted by the laser source 11 enters the beam splitter 12, and is divided by the beam splitter 12 into a first light beam 141 and a second light beam 142 having different transmission paths. The second light beam 142 is reversed and reflected by the reversion assembly 13, enters the beam splitter 12, and exits from the beam splitter 12 together with the first light beam 141. An asymmetry of the second light beam 142 reversed by the reversion assembly 13 is different from an asymmetry of the first light beam 141.

In the embodiments of the present disclosure, an original laser beam 14 emitted by the laser source 11 is divided by the optical compensation system 10 for the laser beam into the first light beam 141 and the second light beam 142. The second light beam 142 is reversed and exits from the beam splitter 12 together with the first light beam 141. That is, the second light beam reversed by the reversion assembly and having the asymmetry different from the first light beam exits from the beam splitter together with the first light beam. Thus, it is able to improve an asymmetry of the original laser beam 14, thereby to improve a stability of the output light beam.

Figure 3:
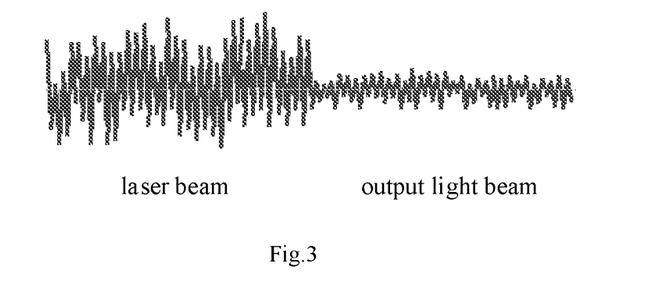
FIG. 3 is a schematic view showing asymmetries of a laser beam and an output light beam according to the embodiments of the present disclosure.

In some embodiments, as shown in FIG. 2, the asymmetry of the second light beam reversed by the reversion assembly 13 is opposite to the asymmetry of the first light beam. Thus, when exiting from the beam splitter together with the first light beam 141, the second light beam 142 may compensate for the asymmetry of the first light beam 141, thereby improving the stability of the output light beam. As shown in FIG. 3, when the laser beam passes through the beam splitter 12 and the reversion assembly 13, it is able to improve the asymmetry of the original laser beam 14, thereby to improve the stability of the output light beam.

In some embodiments, a part of the laser beam is reflected by the beam splitter to form the first light beam, the other part of the laser beam passes through the beam splitter to form the second light beam, the reversion assembly includes at least two reflective mirrors, and the second light beam is sequentially reflected by the at least two reflective mirrors, enters the beam splitter, and exits from the beam splitter together with the first light beam.

In an example, the beam splitter 12 may be a spectroscope. After passing through a beam-splitting surface of the spectroscope, a part of the laser beam 14 may be reflected, so as to form a reflected light beam. The other part thereof may pass through the spectroscope, so as to form a transmitted light beam. Thus, the laser beam 14 is divided into two light beams having different transmission paths.

As shown in FIGS. 2 and 5, a transmission direction of the laser beam 14 and a transmission direction of the first light beam 141 and the second light beam 142 together exiting from the beam splitter are perpendicular to each other.

It should be appreciated that the laser beam 14 from the laser source 11 may enter the beam splitter 12 directly, or, the laser beam 14 from the laser source 11 enters the beam splitter 12 after passing through other components.

In some embodiments, the laser source includes an XeCl excimer laser.

The XeCl excimer laser is a laser having a medium of Xe and HCl gases. A wavelength of the laser beam 14 emitted by the XeCl excimer laser may be 308 nm. The original laser beam 14 emitted by the XeCl excimer laser is asymmetric and jitters severely. When the laser beam 14 is formed into a linear light beam, an instability of the original laser beam 14 emitted by the XeCl excimer laser may cause an instability of the linear light beam.

Figure 4:
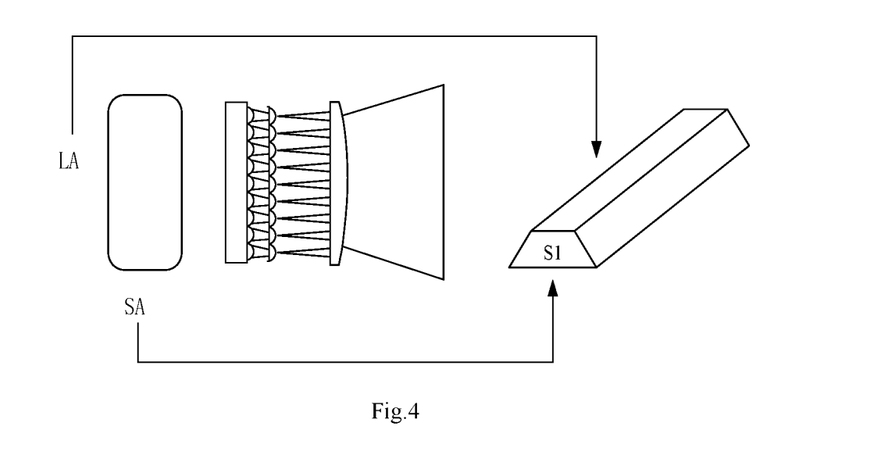
FIG. 4 is a schematic view showing a shaping of a linear light beam according to the embodiments of the present disclosure.

In FIG. 4, a short axis (SA) profile of the original laser beam 14 may form a short axis profile of a linear light beam. Thus, the more severe the jitter of the original beam, the worse the stability of the linear beam. As shown in FIG. 4, the short axis profile includes a trapezoidal cross-section denoting as S1. The more severe the jitter of the original laser beam, the worse a symmetry of the trapezoidal cross-section. The original laser beam 14 emitted by the laser source 11 is divided by the optical compensation system 10 for the laser beam into the first light beam 141 and the second light beam 142. The second light beam 142 is reversed and exits from the beam splitter 12 together with the first light beam 141. Therefore, it is able to mitigate the asymmetry of the original laser beam 14, thereby to improve the stability of the output light beam.

Referring to FIG. 1 again, in some embodiments, a part of the laser beam 14 emitted by the laser source 11 is reflected by the beam splitter 12, so as to form the first light beam 141. The other part of the laser beam 14 emitted by the laser source 11 passes through the beam splitter 12, so as to form the second light beam 142. The reversion assembly 13 includes a first reflective mirror 131 and a second reflective mirror 132, and the second light beam 142 is sequentially reflected by the first reflective mirror 131 and the second reflective mirror 132, passes through the beam splitter 12, and exits from the beam splitter together with the first light beam 141.

In some embodiments, the first reflective mirror 131 and the second reflective mirror 132 cooperate with each other, so as to enable the asymmetry of the second light beam 142 to be opposite to the asymmetry of the first light beam 141.

In some embodiments, a light ray of the laser beam at a first position is reflected by the beam splitter, to form a light ray of the first light beam at a second position, a light ray of the laser beam at a third position is reflected by the beam splitter to form a light ray of the first light beam at a fourth position, a direction from the third position to the first position is the transmission direction of the first light beam and the second light beam together exiting from the beam splitter, a direction from the fourth position to the third position is the transmission direction of the laser beam, and the first position and the third position are symmetrical with respect to a center line of the laser beam. Another light ray of the laser beam at the first position passes through the beam splitter, is reversed by the reversion assembly, passes through the beam splitter again, and exits at the fourth position together with the light ray of the first light beam at the fourth position. Another light ray of the laser beam at the third position passes through the beam splitter, is reversed by the reversion assembly, passes through the beam splitter again, and exits at the second position together with the light ray of the first light beam at the second position.

For example, as shown in FIG. 1, a light ray of the laser beam at a first position A is reflected by the beam splitter 12, to form a light ray of the first light beam 141 at a second position B, a light ray of the laser beam at a third position C is reflected by the beam splitter 12, to form a light ray of the first light beam 141 at a fourth position D. The first position A and the third position C are symmetrical with respect to a center line of the laser beam.

Another light ray of the laser beam at the first position A passes through the beam splitter 12, is sequentially reflected by the first reflective mirror 131 and the second reflective mirror 132, passes through the beam splitter 12 again, and exits at the fourth position D together with the light ray of the first light beam at the fourth position D. Another light ray of the laser beam at the third position passes through the beam splitter, is sequentially reflected by the first reflective mirror 131 and the second reflective mirror 132, passes through the beam splitter 12 again, and exits at the second position B together with the light ray of the first light beam 141 at the second position B.

In some embodiments, the first position A and the third position C are symmetrical with respect to the center line of the laser beam in a first direction. In some embodiments, the first direction is parallel to the transmission direction of the first light beam 141 and the second light beam 142 together exiting from the beam splitter, and a second direction is parallel to the transmission direction of the laser beam.

In an embodiment shown in FIG. 1, a light ray of the laser beam 14 on an upper side is reflected by the beam splitter 12, to form a light ray of the first light beam 141 on a right side. A light ray of the laser beam 14 on a lower side is reflected by the beam splitter 12, to form a light ray of the first light beam 141 on a left side. Another light ray of the laser beam 14 on the upper side passes through the beam splitter 12, is reflected by the first reflective mirror 131 and the second reflective mirror 132, to form a light ray of the reversed second light beam 142 on a left side. Another light ray of the laser beam 14 on the lower side passes through the beam splitter 12, is reflected by the first reflective mirror 131 and the second reflective mirror 132, to form a light ray of the reversed second light beam 142 on a right side. Therefore, when the first light beam 141 and the second light beam 142 together exit from the beam splitter, it is able to achieve mutual compensation, thereby to improve the stability of the output light beam.

Further, in some embodiments, a transmission direction of the first light beam 141 and the transmission direction of the laser light beam 14 are perpendicular to each other, and an angle between a reflection surface of the first reflective mirror 131 and a reflection surface of the second reflective mirror 132 is 45°.

It should be appreciated that, when an incident angle of the laser beam 14 emitted by the laser source 11 entering the beam splitter 12 is 45°, the transmission direction of the first light beam 141 formed by a reflection of the beam splitter 12 and the transmission direction of the laser beam 14 are perpendicular to each other. A transmission direction of the second light beam 142 formed when the laser beam 14 emitted by the laser source 11 passes through the beam splitter 12 is the same as the transmission direction of the laser beam 14. Since the angle between the reflection surface of the first reflective mirror 131 and the reflection surface of the second reflective mirror 132 is 45°, the transmission direction of the second light beam 142 after sequentially passing through the first reflective mirror and the second reflective mirror may be perpendicular to the transmission direction of the laser beam 14, it is able for the second light beam to exit together with the first light beam 141 after passing through the beam splitter 12.

Optionally, in some embodiments, an incident angle of the second light beam 142 entering the first reflective mirror 131 is less than 45°. In this regard, an angle between the reflection surface of the first reflective mirror 131 and a beam-splitting surface of the beam splitter 12 is less than 90°.

In other embodiments, a relationship between the transmission direction of the first light beam 141 and the transmission direction of the laser beam 14 may not be limited to the above-discussed cases. An appropriate reflection angle may be selected according to actual needs. Accordingly, the angle between the reflection surface of the first reflective mirror 131 and the reflection surface of the second reflective mirror 132 may also be flexibly configured according to actual needs, which is not particularly defined herein.

Referring to FIG. 5, in some embodiments, a part of the laser beam 14 passes through the beam splitter 12, to form the first light beam 141, and the other part of the laser beam 14 is reflected by the beam splitter 12, to form the second light beam 142. The reversion assembly 13 includes a first reflective mirror 131, a second reflective mirror 132 and a third reflective mirror. The second light beam 142 is sequentially reflected by the first reflective mirror 131, the second reflective mirror 132 and the third reflective mirror 133, enters the beam splitter 12, and is reflected by the beam splitter 12, to transmit together with the first light beam 141.

In some embodiments, a transmission direction of the output light beam is the same as the transmission direction of the laser beam 14 entering the beam splitter 12. The first reflective mirror 131, the second reflective mirror 133 and the third reflective mirror 133 cooperate with each other, so as to enable the asymmetry of the second light beam 142 to be opposite to the asymmetry of the first light beam 141.

In FIG. 5, a light-ray position distribution of the first light beam 141 formed by the laser beam 14 passing through the beam splitter 12 is the same as a light-ray position distribution of the laser beam 14. A light ray of the laser beam 14 on an upper side is reflected by the beam splitter 12, sequentially reflected by the first reflective mirror 131, the second reflective mirror 132 and the third reflective mirror 133, and then reflected by the beam splitter 12 again, to form a light ray of the reversed second light beam 142 on a lower side. A light ray of the laser beam 14 on a lower side is reflected by the beam splitter 12, sequentially reflected by the first reflective mirror 131, the second reflective mirror 132 and the third reflective mirror 133, and then reflected by the beam splitter 12 again, to form a light ray of the reversed second light beam 142 on an upper side. Therefore, when the first light beam 141 and the second light beam 142 together exit from the beam splitter, it is able to achieve mutual compensation, thereby to improve the stability of the output light beam.

Further, in some embodiments, an angle between a reflection surface of the first reflective mirror 131 and a reflection surface of the second reflective mirror 132 is equal to an angle between the reflection surface of the second reflective mirror 132 and a reflection surface of the third reflective mirror 133.

It should be appreciated that, an incident angle and a reflection angle of a light when reflected by a reflective mirror are equal. That is, an incident angle and a reflection angle of the second light beam 142 when reflected by the second reflective mirror 132 are equal. In the case that the angle between the reflection surface of the first reflective mirror 131 and the reflection surface of the second reflective mirror 132 is equal to the angle between the reflection surface of the second reflective mirror 132 and the reflection surface of the third reflective mirror 133, the incident angles of the second light beam 142 entering the first reflective mirror 131 and the second reflective mirror 132 are equal to each other. In this regard, a transmission direction of the second light beam 142 entering the first reflective mirror 131 is the same as a transmission direction of a third light beam reflected by the third reflective mirror 133.

Optionally, in some embodiments, the incident angle of the second light beam 142 entering the first reflective mirror 131 is less than 45°. It should be appreciated that the angle between the reflection surface of the second reflective mirror 132 and the reflection surface of the first reflective mirror 131 is related to an incident angle of the second light beam 142 entering the first reflective mirror 131. That is, in the case that the angle between the reflection surface of the second reflective mirror 132 and the reflection surface of the first reflective mirror 131 is determined, the incident angle of the second light beam 142 entering the first reflective mirror 131 is determined, so as to enable the reversed second light beam 142 to exit together with the first light beam. Relative positions of the first reflective mirror 131, the second reflective mirror 132 and the third reflective mirror 133 may be set reasonably according to practical applications. In an example, an angle between any two of the reflection surface of the first reflective mirror 131, the reflection surface of the second reflective mirror 132 and the reflection surface of the third reflective mirror 133 is 60°, and the incident angle of the second light beam 142 entering the first reflective mirror 131 is 30°.

As shown in FIG. 5, orthographic projections of the first reflective mirror 131, the second reflective mirror 132 and the third reflective mirror 133 onto a same plane form a triangle-like shape, and an orthographic projection of the beam splitter onto the same plane crosses a line connecting any point of an orthographic projection of the first reflective mirror onto the same plane and any point of an orthographic projection of the third reflective mirror onto the same plane.

In other embodiments, the number of the reflective mirrors and positional relationship among the reflective mirrors in the reversion assembly 13 are not limited to the above-discussed cases, and may be flexibly set according to practical applications. For example, more than three reflective mirrors may be included in the reversion assembly 13, so as to cooperate with each other to obtain the second light beam 142, the asymmetry of which is opposite to the asymmetry of the first light beam 141, which is not particularly defined herein.

In other embodiments, the reversion assembly 13 is not limited to the implementation of the reflective mirrors to obtain the second light beam 142, the asymmetry of which is opposite to the asymmetry of the first light beam 141. A combination of reflective mirrors, lenses, and/or gratings may be used according to actual needs.

In some embodiments, a ratio of the first light beam 141 to the second light beam 142 is 1:1.

It should be appreciated that, in the present disclosure, when the first light beam 141 and the second light beam 142 together exit from the beam splitter, it is able to achieve mutual compensation. In the case that proportions of the first light beam 141 and the second light beam 142 in the output light beam are the same, it is able to ensure the stability of the output light beam. Since the second light beam 142 reversed by the reversion assembly 13 passes through the beam splitter 12 again, and is also divided by the beam splitter 12 may into a reflected light beam and a transmitted light beam in a proportional manner, a proportion of the second light beam 142 formed when the laser beam 14 is divided by the beam splitter 12 may be slightly larger than a proportion of the first light beam 141.

Figure 6:
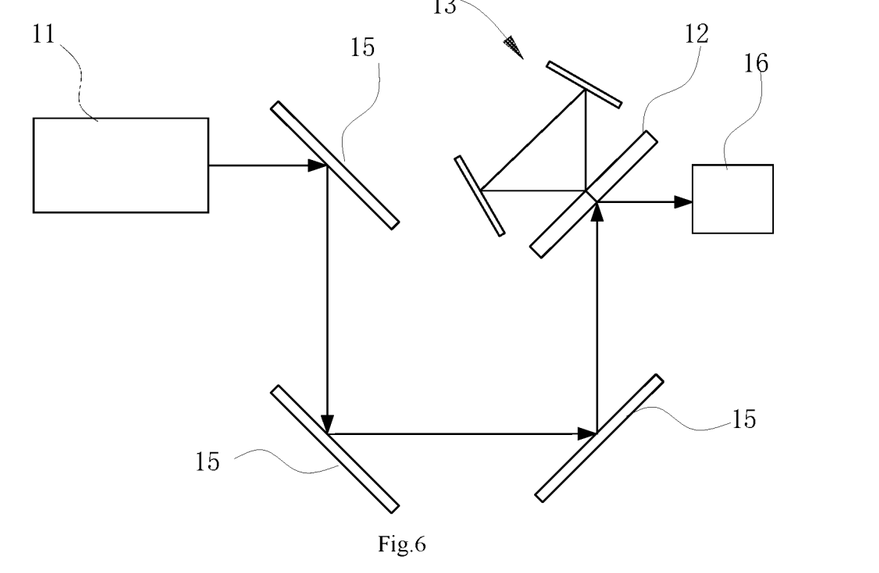
FIG. 6 is yet another structural diagram of the optical compensation system for the laser beam according to the embodiments of the present disclosure.

Referring to FIG. 6, in some embodiments, the optical compensation system 10 for the laser beam includes a transmission assembly 15 configured to transmit the laser beam emitted by the laser source 11 to the beam splitter 12.

The transmission assembly 15 may control a transmission path of the laser beam 14, so as to enable the laser beam 14 emitted by the laser source 11 to transmit to the beam splitter 12 and the reversion assembly 13 in a predetermined direction, thereby to control an angle during a beam transmission. It is able for beam splitter 12 and the reversion assembly 13 to compensate the asymmetry of the laser beam 14, thereby improving the stability of the output light beam.

In some examples, the transmission assembly 15 may also adjust other characteristics of the laser beam 14 through a cooperation of other optical elements.

In some embodiments, the optical compensation system 10 for the laser beam further includes a homogenizing lens 16 configured to convert the first light beam and the second light beam together exiting from the beam splitter into a linear light beam. In an example, the homogenizing lens 16 may form a linear light beam of 1000 mm*0.6 mm.

The embodiments of the present disclosure provide an excimer laser annealing device (not shown) including the optical compensation system 10 for the laser beam according to any of the above embodiments.

In a low-temperature polysilicon thin film manufacturing process, line scanning is performed on a heated amorphous silicon thin film on a substrate by using the excimer laser annealing device, so as to anneal the amorphous silicon thin film, thereby to form a polysilicon thin film. In the excimer laser annealing device of the embodiments of the present disclosure, the original laser beam 14 emitted by the laser source 11 is divided by the optical compensation system 10 for the laser beam into the first light beam 141 and the second light beam 142. The second light beam 142 is reversed and exits together with the first light beam 141, it is able to mitigate the asymmetry of the original laser beam 14, thereby to improve the stability of the output light beam.

In the case that a mitigated output light beam is used to perform annealing on the amorphous silicon film in the excimer laser annealing device, it is able to improve a quality of the polysilicon film, improve a flatness of a film surface, and control a grain size and grain uniformity in a better manner.

Such phrases as "one embodiment", "embodiments", "examples" and "for example" intend to indicate that the features, structures or materials are contained in at least one embodiment or example of the present disclosure, rather than referring to an identical embodiment or example. In addition, the features, structures or materials may be combined in any embodiment or embodiments in an appropriate manner.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. An optical compensation system for a laser beam, comprising a laser source, a beam splitter and a reversion assembly, wherein the laser beam emitted by the laser source enters the beam splitter, and is divided by the beam splitter into a first light beam and a second light beam having different transmission paths, and the second light beam is reversed and reflected by the reversion assembly, enters the beam splitter, and exits from the beam splitter together with the first light beam, wherein an asymmetry of the second light beam reversed by the reversion assembly is different from an asymmetry of the first light beam;

wherein a part of the laser beam passes through the beam splitter, to form the first light beam, the other part of the laser beam is reflected by the beam splitter, to form the second light beam, the reversion assembly comprises at least two reflective mirrors, and the second light beam is sequentially reflected by the at least two reflective mirrors, enters the beam splitter, and exits from the beam splitter together with the first light beam;

wherein the reversion assembly comprises a first reflective mirror, a second reflective mirror and a third reflective mirror, the second light beam is sequentially reflected by the first reflective mirror, the second reflective mirror and the third reflective mirror, enters the beam splitter, and is reflected by the beam splitter, to transmit together with the first light beam; wherein orthographic projections of the first reflective mirror, the second reflective mirror and the third reflective mirror onto a same plane form a triangle-like shape, and an orthographic projection of the beam splitter onto the same plane crosses a line connecting any point of an orthographic projection of the first reflective mirror onto the same plane and any point of an orthographic projection of the third reflective mirror onto the same plane;

wherein a transmission direction of the laser beam is the same as a transmission direction of the first light beam and the second light beam together exiting from the beam splitter.

2. The optical compensation system for the laser beam according to claim 1, wherein the asymmetry of the second light beam reversed by the reversion assembly is opposite to the asymmetry of the first light beam.

3. The optical compensation system for the laser beam according to claim 1, wherein an angle between a reflection surface of the first reflective mirror and a reflection surface of the second reflective mirror is equal to an angle between the reflection surface of the second reflective mirror and a reflection surface of the third reflective mirror.

4. The optical compensation system for the laser beam according to claim 1, wherein the angle between the reflection surface of the first reflective mirror and the reflection surface of the second reflective mirror, the angle between the reflection surface of the second reflective mirror and the reflection surface of the third reflective mirror, and an angle between the reflection surface of the first reflective mirror and the reflection surface of the third reflective mirror are equal to each other.

5. The optical compensation system for the laser beam according to claim 1, wherein a ratio of the first light beam to the second light beam is 1:1.

6. The optical compensation system for the laser beam according to claim 1, further comprising a transmission assembly configured to transmit the laser beam emitted by the laser source to the beam splitter.

7. The optical compensation system for the laser beam according to claim 1, further comprising a homogenizing lens configured to convert the first light beam and the second light beam together exiting from the beam splitter into a linear light beam.

8. The optical compensation system for the laser beam according to claim 1, wherein the laser source comprises an XeCl excimer laser.

9. An excimer laser annealing device, comprising an optical compensation system for a laser beam, wherein the optical compensation system for the laser beam comprises a laser source, a beam splitter and a reversion assembly, the laser beam emitted by the laser source enters the beam splitter, and is divided by the beam splitter into a first light beam and a second light beam having different transmission paths, and the second light beam is reversed and reflected by the reversion assembly, enters the beam splitter, and exits from the beam splitter together with the first light beam, wherein an asymmetry of the second light beam reversed by the reversion assembly is different from an asymmetry of the first light beam;

wherein a part of the laser beam passes through the beam splitter, to form the first light beam, the other part of the laser beam is reflected by the beam splitter, to form the second light beam, the reversion assembly comprises at least two reflective mirrors, and the second light beam is sequentially reflected by the at least two reflective mirrors, enters the beam splitter, and exits from the beam splitter together with the first light beam;

wherein the reversion assembly comprises a first reflective mirror, a second reflective mirror and a third reflective mirror, the second light beam is sequentially reflected by the first reflective mirror, the second reflective mirror and the third reflective mirror, enters the beam splitter, and is reflected by the beam splitter, to transmit together with the first light beam; wherein orthographic projections of the first reflective mirror, the second reflective mirror and the third reflective mirror onto a same plane form a triangle-like shape, and an orthographic projection of the beam splitter onto the same plane crosses a line connecting any point of an orthographic projection of the first reflective mirror onto the same plane and any point of an orthographic projection of the third reflective mirror onto the same plane;

wherein a transmission direction of the laser beam is the same as a transmission direction of the first light beam and the second light beam together exiting from the beam splitter.

10. The excimer laser annealing device according to claim 9, wherein the asymmetry of the second light beam reversed by the reversion assembly is opposite to the asymmetry of the first light beam.

11. The excimer laser annealing device according to claim 9, wherein an angle between a reflection surface of the first reflective mirror and a reflection surface of the second reflective mirror is equal to an angle between the reflection surface of the second reflective mirror and a reflection surface of the third reflective mirror.

12. The excimer laser annealing device according to claim 9, wherein the angle between the reflection surface of the first reflective mirror and the reflection surface of the second reflective mirror, the angle between the reflection surface of the second reflective mirror and the reflection surface of the third reflective mirror, and an angle between the reflection surface of the first reflective mirror and the reflection surface of the third reflective mirror are equal to each other.

\* \* \* \* \*